United States Patent
Jen et al.

(10) Patent No.: US 10,317,972 B2
(45) Date of Patent: Jun. 11, 2019

(54) POWER DISTRIBUTION UNIT WITH HOT-SWAPPABLE MODULE AND POWER MANAGEMENT SYSTEM

(71) Applicant: DELTA ELECTRONICS, INC., Taoyuan (TW)

(72) Inventors: Yu-Chi Jen, Taoyuan (TW); Chih-Chiang Chan, Taoyuan (TW); Chin Lien, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 9 days.

(21) Appl. No.: 15/612,437

(22) Filed: Jun. 2, 2017

(65) Prior Publication Data

US 2018/0131163 A1   May 10, 2018

(30) Foreign Application Priority Data

Nov. 7, 2016   (TW) .............................. 105136163 A

(51) Int. Cl.
| | |
|---|---|
| H05K 7/14 | (2006.01) |
| G06F 1/18 | (2006.01) |
| G06F 1/26 | (2006.01) |
| H02J 13/00 | (2006.01) |
| H01R 25/00 | (2006.01) |

(52) U.S. Cl.
CPC .............. *G06F 1/266* (2013.01); *G06F 1/189* (2013.01); *H02J 13/0006* (2013.01); *H05K 7/1492* (2013.01); *H01R 25/006* (2013.01)

(58) Field of Classification Search
None
See application file for complete search history.

(56) References Cited

U.S. PATENT DOCUMENTS

| | | | |
|---|---|---|---|
| 6,220,880 B1* | 4/2001 | Lee ...................... | H01R 25/003 439/214 |
| 7,544,077 B1* | 6/2009 | Martin ................. | H01R 25/161 200/16 R |
| 9,414,456 B2* | 8/2016 | Wong .................. | F21V 23/0464 |
| 9,520,043 B1* | 12/2016 | Alshinnawi .......... | G08B 21/182 |
| 9,524,005 B2* | 12/2016 | Saez ....................... | G06F 1/181 |
| 2005/0105235 A1* | 5/2005 | Yu ......................... | H01R 13/713 361/118 |
| 2008/0272878 A1* | 11/2008 | Ewing .................... | H01R 25/00 337/265 |

(Continued)

FOREIGN PATENT DOCUMENTS

TW   200906023 A   2/2009

*Primary Examiner* — Courtney L Smith
(74) *Attorney, Agent, or Firm* — Kirton McConkie; Evan R. Witt

(57) ABSTRACT

A power distribution unit includes a power input terminal, a main body, plural power-providing units, a coupling module and a hot-swappable module. The plural power-providing units are installed on the main body and electrically connected with plural electronic devices to provide electric power to the plural electronic devices. The coupling module is embedded within the main body. The hot-swappable module is detachably connected with the coupling module. When the hot-swappable module is connected with and disposed within the coupling module, the power distribution unit is in communication with a remote power management unit and/or an adjacent power distribution unit.

15 Claims, 9 Drawing Sheets

(56) References Cited

U.S. PATENT DOCUMENTS

| | | | | |
|---|---|---|---|---|
| 2011/0205693 A1* | 8/2011 | Jansma | ............ | G06F 1/266 |
| | | | | 361/601 |
| 2012/0092811 A1* | 4/2012 | Chapel | ............ | H04L 12/10 |
| | | | | 361/622 |
| 2012/0307421 A1* | 12/2012 | Ewing | ............ | H01R 25/006 |
| | | | | 361/622 |
| 2013/0049466 A1* | 2/2013 | Adams | ............ | G06F 1/266 |
| | | | | 307/39 |
| 2013/0294014 A1* | 11/2013 | Irons | ............ | H02B 7/00 |
| | | | | 361/626 |
| 2015/0236507 A1* | 8/2015 | Burant | ............ | H02H 3/105 |
| | | | | 307/23 |
| 2015/0263513 A1* | 9/2015 | Newell | ............ | H02H 7/22 |
| | | | | 361/111 |
| 2017/0315950 A1* | 11/2017 | Whitney | ............ | H04L 67/12 |
| 2017/0354056 A1* | 12/2017 | Irons | ............ | H05K 7/1491 |

* cited by examiner

POWER DISTRIBUTION UNIT WITH HOT-SWAPPABLE MODULE AND POWER MANAGEMENT SYSTEM

FIELD OF THE INVENTION

The present invention relates to a power distribution unit, and more particularly to a power distribution unit with a hot-swappable module and a power management system with the power distribution unit.

BACKGROUND OF THE INVENTION

With increasing development of information industries and networks, the services provided through networks are becoming more and more appealing in various applications. Recently, with development of high-tech industries, the concepts of the cloud computing technology and the cloud storage device have been emerged, and thus a data center becomes more important. The data center is a facility used to house a plurality of computers or servers. For providing intensive network applications, the numbers of computers or servers of the data center need to be increased to exchange and store data. Consequently, the devices for supplying, distributing and managing electric power become more important. Generally, a power distribution unit (PDU) is used to distribute electric power among computers or servers of the data center. Moreover, a remote power management unit is used to manage each power distribution unit. Consequently, the power utilization efficiency of the overall data center is optimized.

FIG. 1 schematically illustrates the architecture of a conventional power management system of a data center. FIG. 2 is a schematic functional block diagram illustrating the architecture of the conventional power management system of the data center.

The conventional power management system 1 comprises a remote power management unit 11, a first local management unit 131, a second local management unit 132, a first group of power distribution units 141 and a second group of power distribution units 142. The power distribution units 141 in the first group are in communication with the remote power management unit 11 through the first local management unit 131. The power distribution units 142 in the second group are in communication with the remote power management unit 11 through the second local management unit 132. As shown in FIG. 1, the power distribution units 141 in the first group comprise power distribution units 141a, 141b and 141c, and the power distribution units 141a, 141b and 141c are connected with electronic devices 151, 152 and 153. For example, the electronic devices are computers or servers. Since the power distribution units 141a, 141b and 141c are in communication with the remote power management unit 11 through the first local management unit 131, the electronic devices 151, 152 and 153 can be controlled by the remote power management unit 11. Moreover, the electronic devices 151, 152 and 153 are stacked on each other and accommodated within a rack cabinet 16. A data center comprises plural rack cabinets 16 according to a cloud computing technology. As shown in FIG. 1, the electronic devices 151, 152 and 153 are connected with the power distribution units 141a, 141b and 141c, respectively. Moreover, each of the power distribution units 141a, 141b and 141c comprises plural sockets. That is, each of the power distribution units 141a, 141b and 141c can be connected with plural electronic devices. Moreover, each socket is connected with a switch element (not shown). By controlling the on/off states of the sockets, the electric power provided to the plural electronic devices can be managed, distributed and controlled.

In FIG. 2, the first local management unit 131 and the second local management unit 132 of the power management system 1 are shown. The power distribution units 141 in the first group comprise the power distribution units 141a, 141b and 141c. The power distribution units 141a, 141b and 141c are in communication with the first local management unit 131. Consequently, the power distribution units 141a, 141b and 141c have an exclusive single IP address. Similarly, the power distribution units 142 in the second group comprise power distribution units 142a, 142b and 142c. The power distribution units 142a, 142b and 142c are in communication with the second local management unit 132. Consequently, the power distribution units 142a, 142b and 142c have another exclusive single IP address. In addition, the first local management unit 131 and the second local management unit 132 are in communication with the remote power management unit 11 through an internet protocol (IP) network 12. Moreover, the remote power management unit 11 exchanges data with the first local management unit 131 and the second local management unit 132 according to the IP communication protocol with the single IP address. Since the remote power management unit 11 is in communication with the first local management unit 131 and the second local management unit 132 to manage the power distribution units 141 and 142 of different groups, the response time and the data transmission amount in the IP network are reduced.

However, the conventional power management system 1 still has some drawbacks. For example, if one of the local management units has malfunction or damage, the power distribution unit connected to the local management unit cannot be in communication with the remote power management unit 11. For example, if the first local management unit 131 has malfunction or damage, the power distribution units 141 in the first group cannot be in communication with the remote power management unit 11 through the network. Under this circumstance, the remote power management unit 11 cannot acquire the information about the operations of the electronic devices 151, 152 and 153 through the network and cannot manage the power distribution units 141a, 141b and 141c. In other words, the power management purpose of the remote power management unit 11 cannot be achieved. Moreover, since the remote power management unit 11 cannot acquire the information about the operations of the electronic devices 151, 152 and 153 through the network, it is necessary to check whether the electronic devices 151, 152 and 153 are not connected to the network or the electronic devices 151, 152 and 153 are damaged or shut down. That is, the conventional power management system is not user-friendly. The maintenance cost of the conventional power management system is high, and the process of checking and maintaining the conventional power management system is time-consuming and costly.

SUMMARY OF THE INVENTION

An object of the present invention provides a power management system with plural power distribution units in order to efficiently acquire the real-time power data of electronic devices, achieve a more stable data transmission path and reduce the maintenance cost.

Another object of the present invention provides a power distribution unit with a hot-swappable function. Due to the hot-swappable function, the hot-swappable module can be easily assembled with or disassembled from the power distribution unit. Since the maintaining and managing process is simplified, the maintenance cost and the management cost of the power management system are reduced In accordance with an aspect of the present invention, there is provided a power distribution unit. The power distribution unit includes a power input terminal, a main body, plural power-providing units, a coupling module and a hot-swappable module. The plural power-providing units are installed on the main body and electrically connected with plural electronic devices to provide electric power to the plural electronic devices. The coupling module is embedded within the main body. The hot-swappable module is detachably connected with the coupling module. When the hot-swappable module is connected with and disposed within the coupling module, the power distribution unit is in communication with a remote power management unit and/or an adjacent power distribution unit.

In accordance with another aspect of the present invention, there is provided a power management system. The power management system includes a remote power management unit, at least one power distribution unit and at least one power supply unit. Each power distribution unit includes a hot-swappable module. The at least one power supply unit is electrically connected with the corresponding power distribution unit. The at least one power distribution unit is in communication with the remote power management unit through an upstream network via the hot-swappable module and in communication with an adjacent power distribution unit through an internal network. An operating data or a power consumption data of the at least one power supply unit is transmitted to the remote power management unit. According to a command from the remote power management unit, electric power of the corresponding power supply unit is controlled and distributed.

In accordance with a further aspect of the present invention, there is provided a power management system. The power management system includes a remote power management unit, plural power distribution units and plural power supply units. Each of the plural power distribution units includes a hot-swappable module. The plural power supply units are electrically connected with the corresponding power distribution units. One of the plural power distribution units is a master power distribution unit, and the others of the plural power distribution units are slave power distribution units. The master power distribution unit is in communication with the remote power management unit through an upstream network via the hot-swappable module and in communication with one of the slave power distribution units through an internal network. The slave power distribution units are in communication with each other through the internal network. Moreover, operating data or power consumption data of the plural power supply units are transmitted to the remote power management unit through the upstream network.

According to a command from the remote power management unit, electric power of the corresponding power supply units is controlled and distributed.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
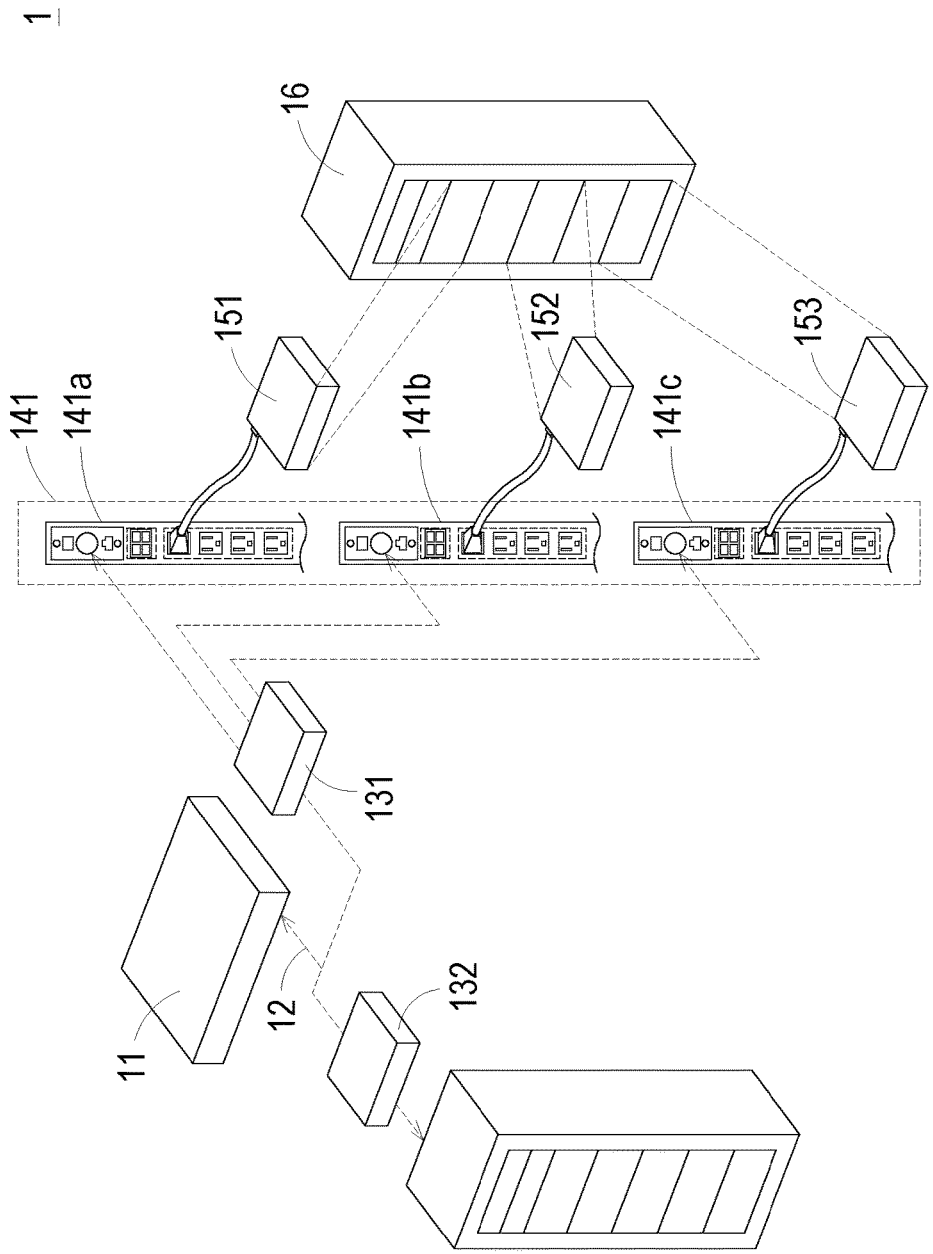
FIG. 1 schematically illustrates the architecture of a conventional power management system of a data center.
Figure 2:
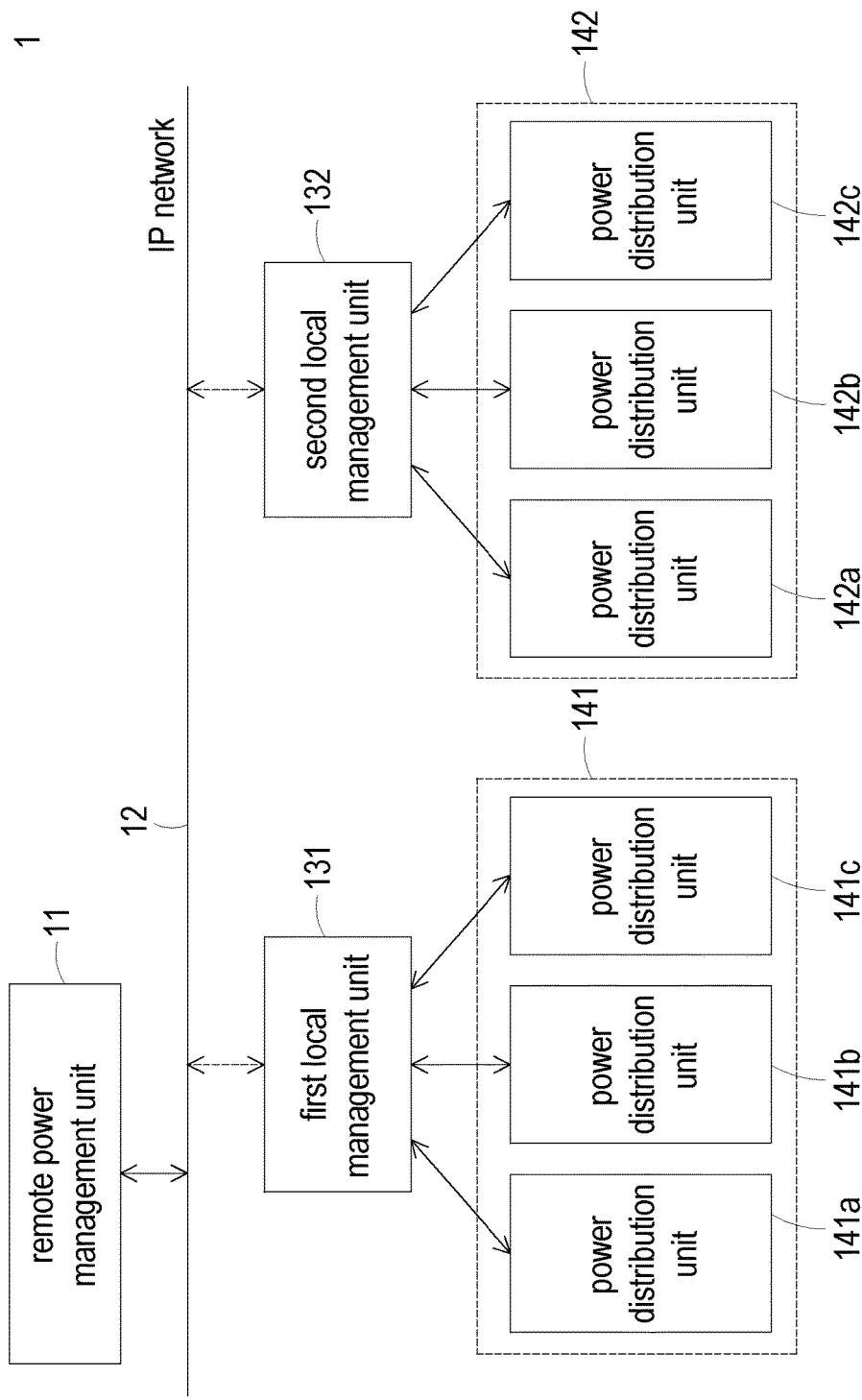
FIG. 2 is a schematic functional block diagram illustrating the architecture of the conventional power management system of the data center.
Figure 3:
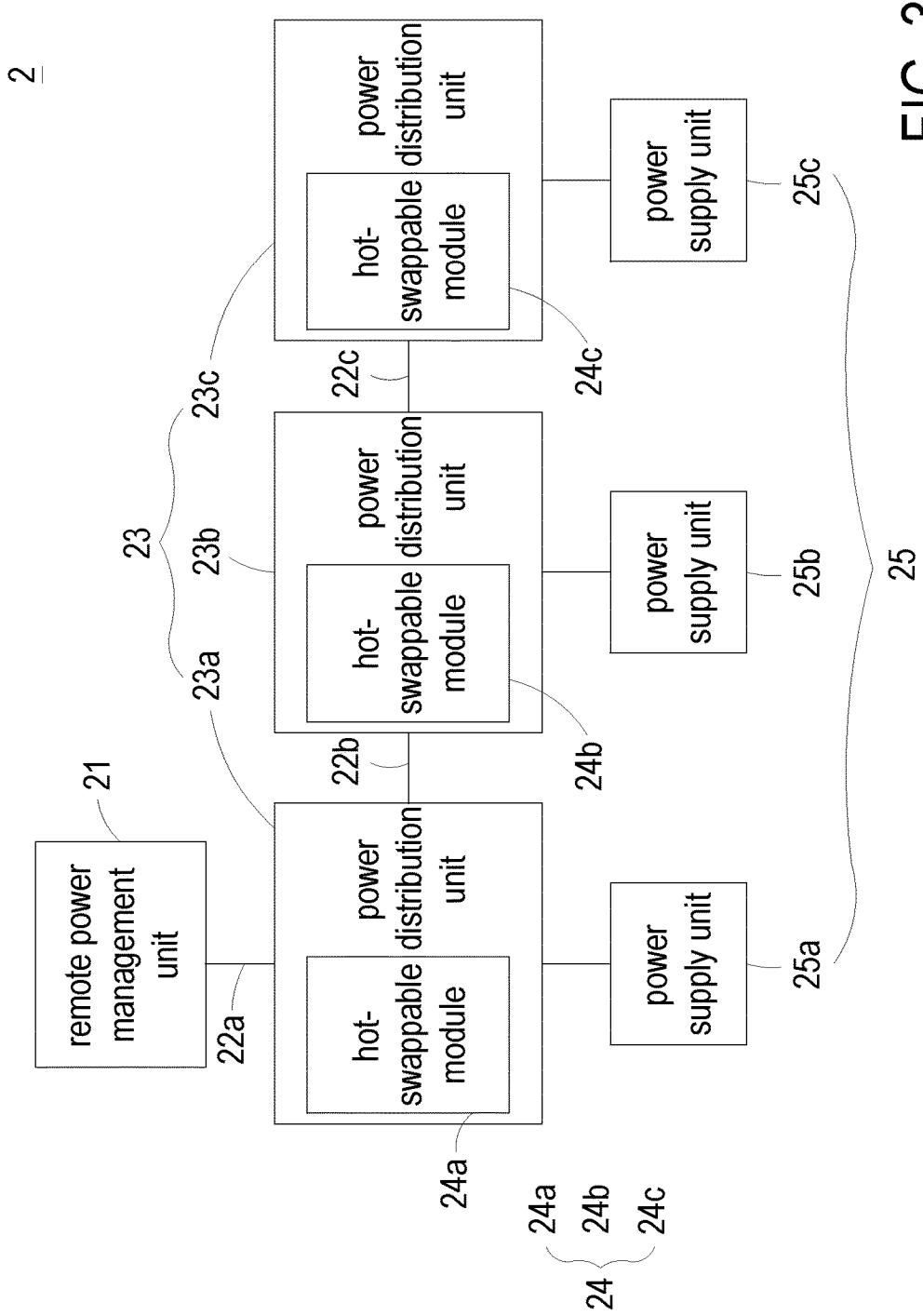
FIG. 3 schematically illustrates the architecture of a power management system according to an embodiment of the present invention.

FIG. 3 schematically illustrates the architecture of a power management system according to an embodiment of the present invention. As shown in FIG. 3, the power management system 2 comprises a remote power management unit 21, at least one power distribution unit 23 and at least one power supply unit 25. The remote power management unit 21 is used for managing and controlling the at least one power supply unit 25 to provide electric power to at least one electronic device (not shown). The at least one power distribution unit 23 is in communication with the remote power management unit 21 through an upstream network 22a and provides electric power to the corresponding power supply unit 25.

In an embodiment, the power management system 2 comprises three power distribution units 23a, 23b and 23c. The power distribution units 23a, 23b and 23c have respective hot-swappable modules 24a, 24b and 24c. Preferably, the hot-swappable modules 24a, 24b and 24c are hot-swappable intelligent modules with communication interfaces, control units or other variations, capable of executing intelligent functions. The hot-swappable modules 24a, 24b and 24c are electrically connected with the power supply units 25a, 25b and 25c, respectively. The power distribution unit 23a is in communication with the remote power management unit 21 through the upstream network 22a via the hot-swappable module 24a. In addition, the power distribution unit 23a is in communication with the power distribution unit 23b through an internal network 22b. Consequently, the operating data or the power consumption data of the power supply unit 25a is transmitted to the remote power management unit 21 through the power distribution unit 23a. Moreover, according to the command from the remote power management unit 21, the electric power of the power supply unit 25a is correspondingly controlled and distributed.

Preferably but not exclusively, the remote power management unit 21 is a network application device that is in communication with client browsers through web servers or in communication with application software through a personal computer.

Please refer to FIG. 3 again. The power distribution unit 23a is in communication with the remote power management unit 21 through the upstream network 22a via the hot-swappable module 24a. In this embodiment, the power distribution unit 23a is used as a master power distribution unit, and the power distribution units 23b and 23c are used as slave power distribution units. The power distribution unit 23a (i.e., the master power distribution unit) is in communication with the power distribution unit 23b (i.e., one slave power distribution unit) through an internal network 22b. The power distribution unit 23b is in communication with the power distribution unit 23c (i.e., another slave power distribution unit) through an internal network 22c. Consequently, the plural power distribution units 23a, 23b and 23c are in communication with each other through the internal networks 22b and 22c. Moreover, the operating data or the power consumption data of the power supply units 25a, 25b and 25c that are connected with the power distribution units 23a, 23b and 23c are transmitted to the remote power management unit 21 through the upstream network 22a with the single IP address via the power distribution unit 23a (i.e., the master power distribution unit). Moreover, the electric power of the power supply unit 25a, the electric power of the power supply unit 25b and the electric power of the power supply unit 25c are correspondingly controlled and distributed according to the command from the remote power management unit 21. Since the power distribution units 23a, 23b and 23c are in communication with the remote power management unit 21 through the upstream network 22a with the single IP address, the managing task load or the processing load of the remote power management unit 21 is reduced. In addition, since the transmission delay of the remote power management unit 21 is avoided, the response time and the data transmission amount in the IP network are reduced.

In comparison with the conventional technologies, the power management system of the present invention is not equipped with the local management units. That is, the power distribution unit 23a (i.e., the master power distribution unit) is in direct communication with the remote power management unit 21. Since the local management units are omitted, the fabricating cost is reduced, the process of connecting and setting the power management system is simplified, and the overall layout is saved. If the power distribution unit 23a (i.e., the master power distribution unit) has malfunction or damage but the network connection is normal, the power distribution unit 23b can be in communication with the remote power management unit 21 through the power distribution unit 23a and the upstream network 22a. Meanwhile, the power distribution unit 23b is used as the master power distribution unit in replace of the power distribution unit 23a. The power distribution unit 23c is still in communication with the remote power management unit 21 through the power distribution unit 23b.

Since the plural serially-connected power distribution units 23 are equipped with the respective hot-swappable modules 24, the overall layout of the power management system 2 is simplified, the polling time is reduced, the loading is reduced, and the networking wire is saved.

Figure 4:
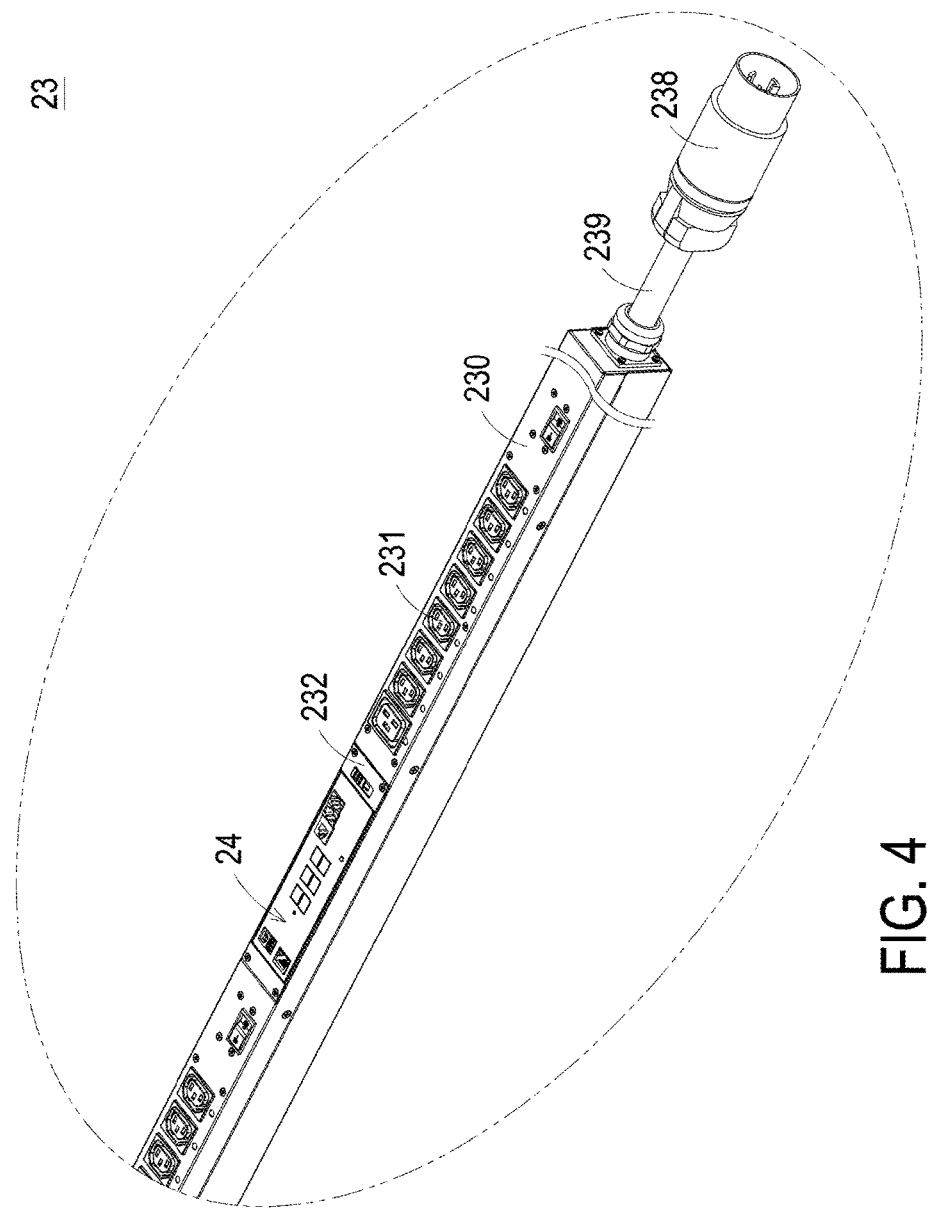
FIG. 4 schematically illustrates the appearance of a power distribution unit used in the power management system of the present invention.

FIG. 4 schematically illustrates the appearance of a power distribution unit used in the power management system of the present invention. As shown in FIG. 4, the power distribution unit 23 comprises a main body 230, plural power-providing units 231, a coupling module 232, a hot-swappable module 24 and a power input terminal 238. Preferably but not exclusively, the power input terminal 238 is a plug. The power input terminal 238 is connected with a utility power source (not shown) or any other appropriate power source to receive electric power. In addition, the power input terminal 238 is connected with the main body 230 through a cable 239. Consequently, the received electric power is transmitted to the main body 230 of the power distribution unit 23 through the cable 239. In an embodiment, the main body 230 is substantially rectangular, and associated electronic components are accommodated within or installed on the main body 230. As shown in FIG. 4, the plural power-providing units 231 are installed on the main body 230. For example, the plural power-providing units 231 are power sockets. When plural power supply units 25 as shown in FIG. 3 are plugged into the corresponding power-providing units 231, the power distribution unit 23 is electrically connected with the plural power supply units 25. Moreover, according to the command from the remote power management unit 21, the electric power of the plural power supply units 25 can be correspondingly controlled and distributed.

As shown in FIG. 4, the coupling module 232 is embedded within the main body 230. The hot-swappable module 24 is detachably connected with the coupling module 232 and accommodated within the coupling module 232. After the hot-swappable module 24 is connected with and accommodated within the coupling module 232, the power distribution unit 23 can be in communication with the remote power management unit 21 and another power distribution unit through the hot-swappable module 24.

Figure 5:
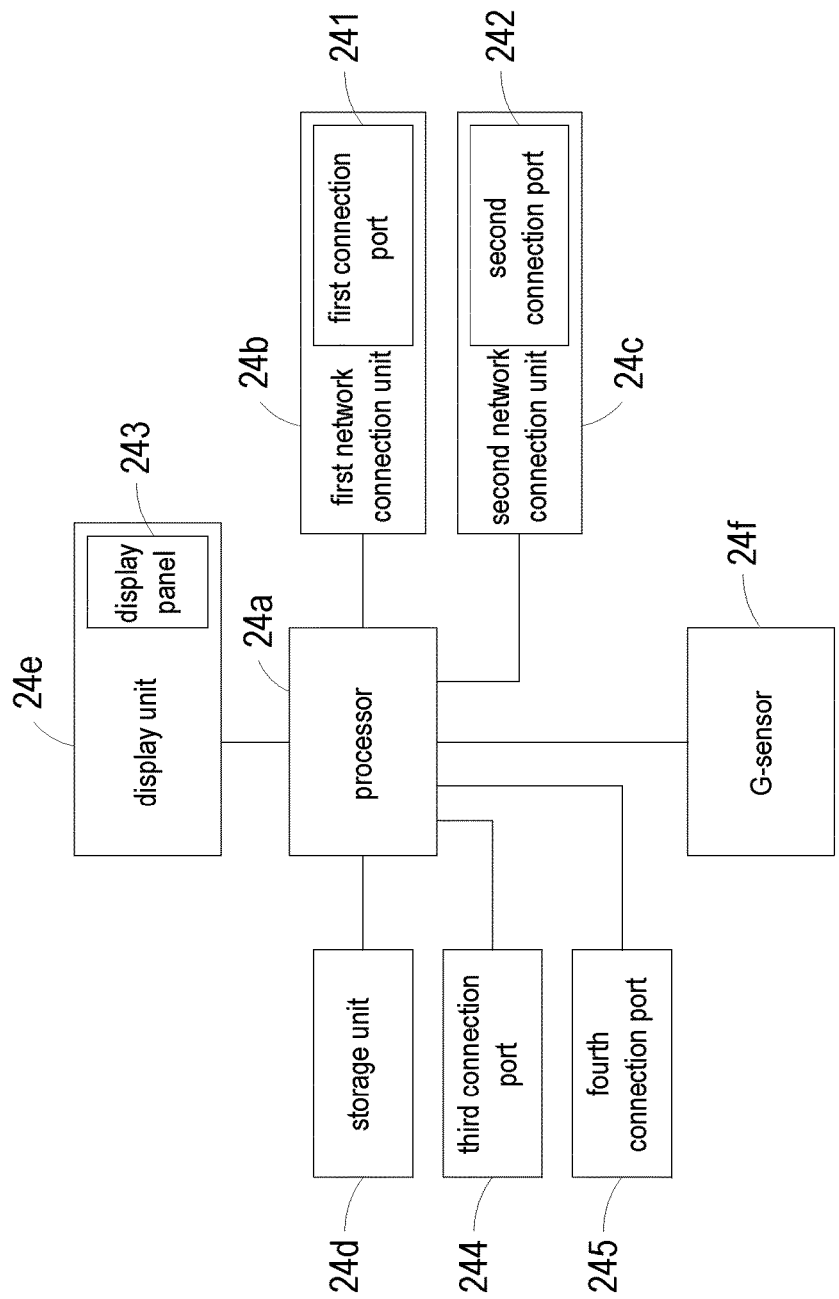
FIG. 5 schematically illustrates the architecture of a hot-swappable module used in the power management system according to the embodiment of the present invention.
Figure 6A:
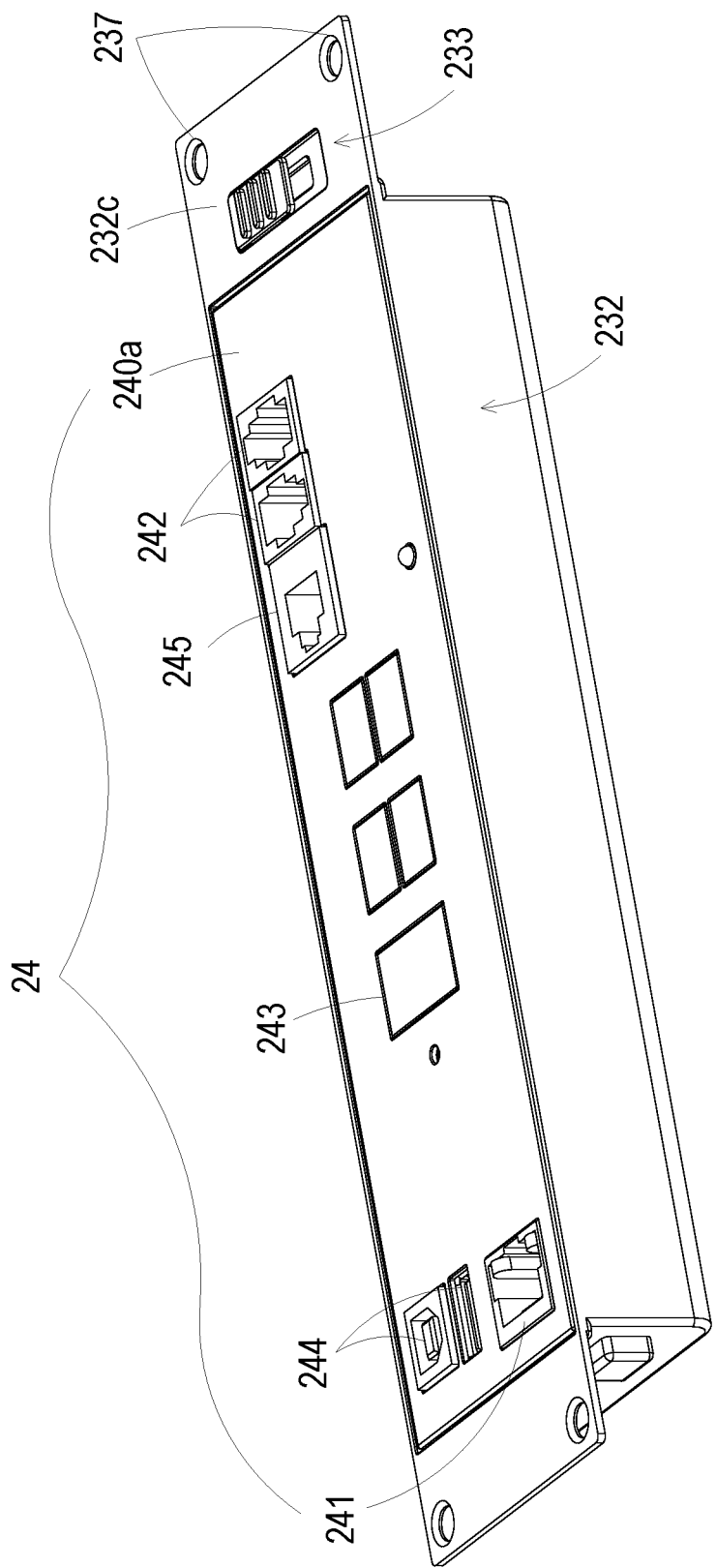
FIG. 6A schematically illustrates the combination of the hot-swappable module and the coupling module.
Figure 6B:
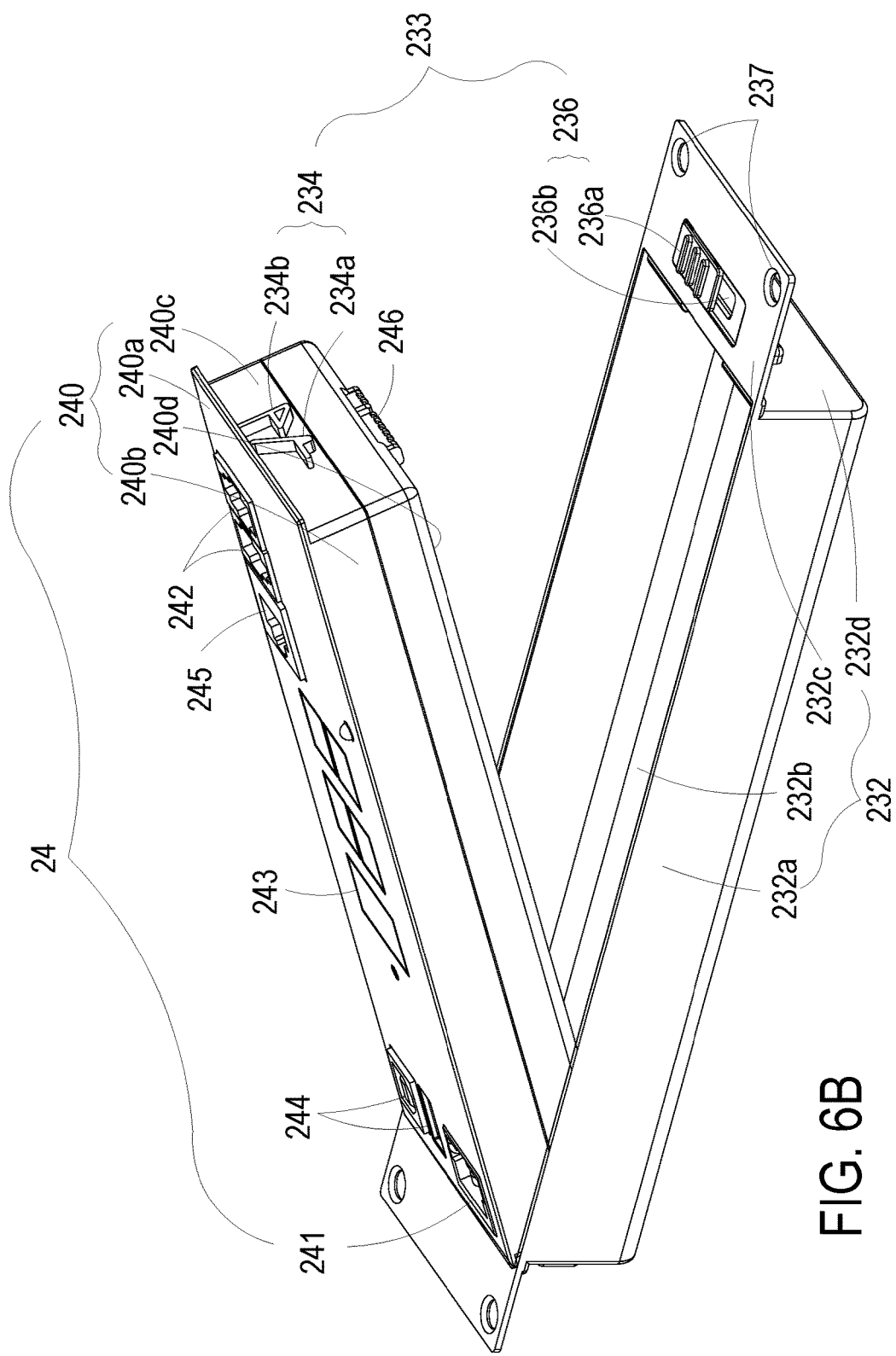
FIG. 6B schematically illustrates the relationship between the hot-swappable module and the coupling module.

Please refer to FIGS. 5, 6A and 6B. FIG. 5 schematically illustrates the architecture of a hot-swappable module used in the power management system according to the embodiment of the present invention. FIG. 6A schematically illustrates the combination of the hot-swappable module and the coupling module. FIG. 6B schematically illustrates the relationship between the hot-swappable module and the coupling module. As shown in FIG. 6B, the hot-swappable module 24 has a rectangular box structure. The hot-swappable module 24 is detachably connected with the coupling module 232 and accommodated within the coupling module 232. The hot-swappable module 24 is hot-swappable. That is, when the hot-swappable module 24 is accommodated within the coupling module 232, a conducting part 246 of the hot-swappable module 24 is contacted with a contact terminal (not shown) of the power distribution unit 23. Consequently, the hot-swappable module 24 is powered and enabled.

As shown in FIG. 5, the hot-swappable module 24 comprises a processor 24a, a first network connection unit 24b, a second network connection unit 24c, a storage unit 24d and a display unit 24e. The processor 24a is used for collecting, computing and analyzing the operating data or the power consumption data from the power supply unit 25 and transmitting the processed data to the remote power management unit 21. Moreover, according to the command from the remote power management unit 21, the electric power of the power supply unit 25 is correspondingly controlled and distributed by the processor 24a. The first network connection unit 24b comprises a first connection port 241. The first connection port 241 is connected with a network cable (not shown) so as to be in communication with the remote power management unit 21 through the upstream network 22*a*. The second network connection unit 24*c* comprises a second connection port 242. The second connection port 242 is connected with another network cable (not shown) so as to be in communication with another power distribution unit through the internal network 22*b*. The operating data or the power consumption data from the power supply unit 25 and the processed data of the processor 24*a* are stored in the storage unit 24*d*. The display unit 24*e* comprises a display panel 243. In an embodiment, the display panel 243 is disposed on a top surface 240*a* of the hot-swappable module 24 in order to display the operating data of the power distribution unit 23.

Please refer to FIG. 5 again. In some embodiments, the hot-swappable module 24 further comprises a G-sensor 24*f*. The G-sensor 24*f* is used for sensing a tilt angle of the hot-swappable module 24 and adjusting the orientation of showing the information of the display panel 243 according to the tilt angle. In some embodiments, the hot-swappable module 24 further comprises plural peripheral communication interfaces (not shown). The peripheral communication interfaces are electrically connected with external devices (not shown). For example, as shown in FIG. 5, the plural peripheral communication interfaces include a third connection port 244 and a fourth connection port 245. The third connection port 244 is connected with an external electronic device (not shown) in order to provide electric power to the external electronic device. The fourth connection port 245 is connected with another external device such as a sensor. The sensor is used for detecting the ambient temperature or humidity of the power distribution unit 23. It is noted that the number of peripheral communication interfaces and the types of the peripheral communication interfaces may be varied according to the practical requirements.

Figure 6C:
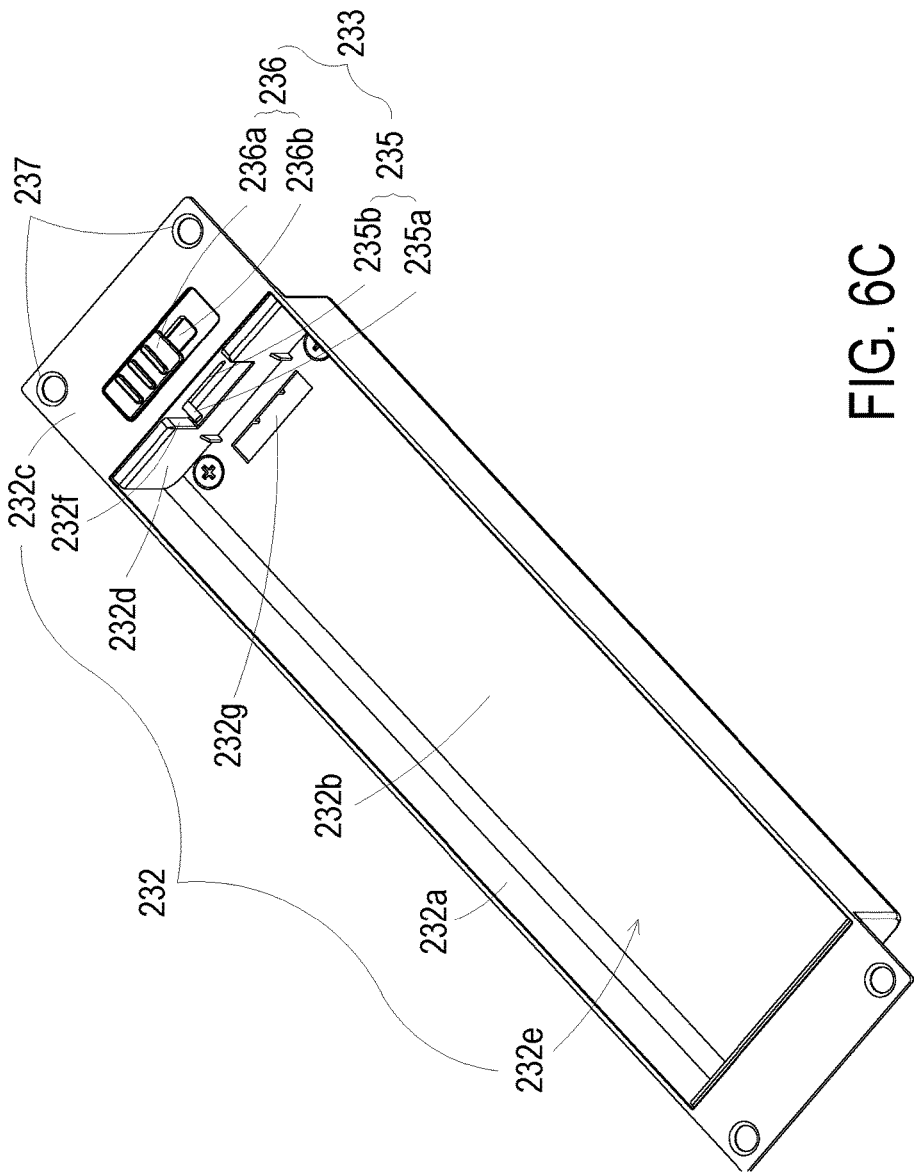
FIG. 6C schematically illustrates the coupling module of FIG. 6A.

FIG. 6C schematically illustrates the coupling module of FIG. 6A. Please refer to FIGS. 6A, 6B and 6C. The coupling module 232 of the power distribution unit 23 comprises an accommodation space 232*e* for accommodating the hot-swappable module 24. When the hot-swappable module 24 is accommodated within the accommodation space 232*e* of the power distribution unit 23, the hot-swappable module 24 is detachably connected with and fixed in the coupling module 232 through an engaging module 233. As shown in FIGS. 6A, 6B and 6C and FIG. 4, the coupling module 232 is a rectangular case with two long lateral plates 232*a*, two short lateral plates 232*d* and a bottom plate 232*b*. The coupling module 232 is formed in the main body 230 of the power distribution unit 23. The accommodation space 232*e* is defined by the long lateral plates 232*a*, the short lateral plates 232*d* and the bottom plate 232*b* collaboratively. Moreover, two extension plates 232*c* are horizontally extended from the top edges of the short lateral plates 232*d*. As shown in FIG. 6A, plural fastening structures 237 (e.g., perforations) are formed in the extension plates 232*c*. After fastening elements (e.g., screws) are penetrated through the fastening structures 237 and tightened in the main body 230 of the power distribution unit 23, the coupling module 232 is securely fined in the main body 230 of the power distribution unit 23.

Please refer to FIGS. 6A and 6B again. As mentioned above, the hot-swappable module 24 has a rectangular box structure. The profile of the hot-swappable module 24 matches the profile of the accommodation space 232*e* of the power distribution unit 23. Consequently, the hot-swappable module 24 is detachably connected with and fixed in the coupling module 232 through an engaging module 233. In an embodiment, the rectangular box structure of the hot-swappable module 24 comprises an outer shell 240 with a top plate 240*a*, two long lateral plates 240*b*, two short lateral plates 240*c* and a bottom plate 240*d*. The long lateral plate 240*b* of the hot-swappable module 24 is slightly shorter than the long lateral plate 232*a* of the coupling module 232. Similarly, the short lateral plate 240*c* of the hot-swappable module 24 is slightly shorter than the short lateral plate 232*d* of the coupling module 232. Consequently, the hot-swappable module 24 is tightly fixed in the accommodation space 232*e* of the power distribution unit 23. An inner space of the hot-swappable module 24 is defined by the top plate 240*a*, the two long lateral plates 240*b*, the two short lateral plates 240*c* and the bottom plate 240*d* collaboratively. Consequently, greater portions of the processor 24*a*, the first network connection unit 24*b*, the second network connection unit 24*c*, the storage unit 24*d*, the display unit 24*e*, the G-sensor 24*f* and the peripheral communication interfaces are received within the inner space of the hot-swappable module 24.

Please refer to FIG. 6A. When the hot-swappable module 24 is accommodated within the accommodation space 232*e* of the power distribution unit 23, the top plate 240*a* is substantially at the same level with the extension plates 232*c* of the coupling module 232. Moreover, the first connection port 241 of the first network connection unit 24*b*, the second connection port 242 of the second network connection unit 24*c*, the display panel 243 of the display unit 24*e* and the third connection port 244 and the fourth connection port 245 of the peripheral communication interfaces are partially exposed to the top plate 240*a*.

An example of the first connection port 241 includes but is not limited to an Ethernet network interface. When the first connection port 241 is connected with a network cable (not shown), the power distribution unit 23 is in communication with the remote power management unit 21 through the upstream network 22*a* with a single IP address. An example of the upstream network 22*a* includes but is not limited to a local area network (LAN) or a wide area network (WAN). The second connection port 242 of the second network connection unit 24*c* is connected with another network cable (not shown) so as to be in communication with another power distribution unit through the internal network 22*b*. An example of the second connection port 242 includes but is not limited to a USB interface, a RS-232 interface, a RS-499 interface, a RS-423 interface, a RS-422 interface, a RS-485 interface, a controller area network (CAN) interface, an IEEE 1394 interface, a fibre channel interface or an Ethernet network interface. Alternatively, the second connection port 242 is a wireless transmission interface such as a Bluetooth interface, an Infini-Band interface or an infrared transmission interface. In the embodiment of FIG. 6A, the third connection port 244 comprises two types of USB interfaces to be connected with different external devices. Consequently, the power distribution unit 23 provides electric power to the external devices. The fourth connection port 245 is a communication interface connected with an external sensor. The numbers and types of the connection ports and communication interfaces of the hot-swappable module 24 can be varied according to the practical requirements.

Figure 7B:
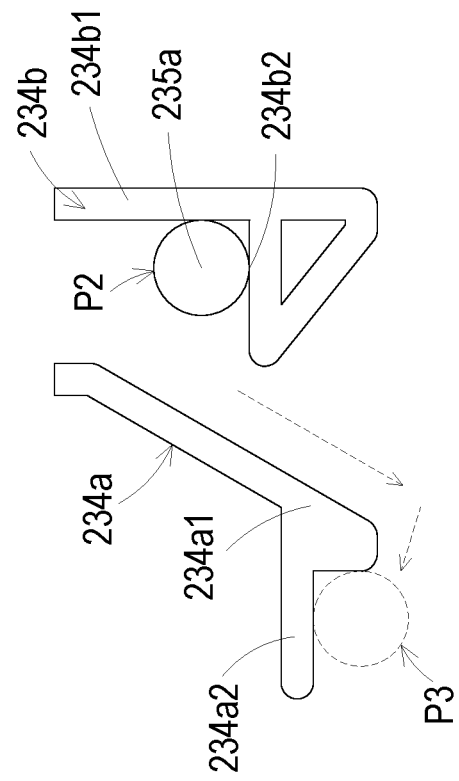
FIG. 7B schematically illustrates the engaging module of the power distribution unit in an unlocked position.
Figure 7A:
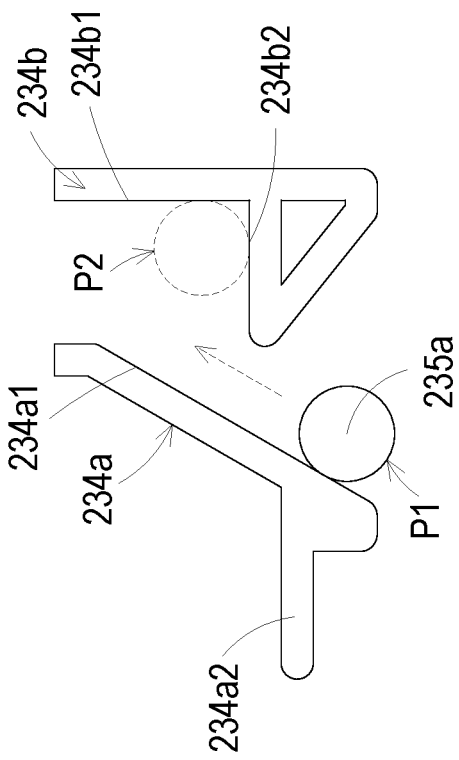
FIG. 7A schematically illustrates the engaging module of the power distribution unit in a locked position.

FIG. 7A schematically illustrates the engaging module of the power distribution unit in a locked position. FIG. 7B schematically illustrates the engaging module of the power distribution unit in an unlocked position. Pleases refer to FIGS. 6A, 6B, 6C, 7A and 7B. In this embodiment, the engaging module 233 comprises a first locking part 234, a second locking part 235 and a pushing part 236. The first locking part 234 is disposed on the hot-swappable module 24. The second locking part 235 and the pushing part 236 are disposed on the coupling module 232 and linked with each other. When the hot-swappable module 24 is accommodated within the accommodation space 232e of the power distribution unit 23, the first locking part 234 and the second locking part 235 are engaged with each other. Consequently, the hot-swappable module 24 is connected with and fixed in the power distribution unit 23. For unlocking the hot-swappable module 24, the user may push the pushing part 236 to move the second locking part 235 to an unlock position P3 (see FIG. 7B). Consequently, the hot-swappable module 24 is disengaged from the accommodation space 232e of the coupling module 232.

As shown in FIG. 6B, the first locking part 234 is located at a short lateral plate 240c of the hot-swappable module 24. In this embodiment, the first locking part 234 comprises a first hook 234a and a second hook 234b. The first hook 234a and the second hook 234b are arranged side by side. The top ends of the first hook 234a and the second hook 234b are located near a bottom surface of the top plate 240a of the hot-swappable module 24. It is noted that the shapes and locations of the first hook 234a and the second hook 234b are not restricted. As shown in FIG. 7A, the first hook 234a comprises an inclined segment 234a1 and a first horizontal segment 234a2, and the second hook 234b comprises a vertical segment 234b1 and a second horizontal segment 234b2. That is, the first hook 234a and the second hook 234b have different structures. By means of the first hook 234a, the second hook 234b and the second locking part 235, the hot-swappable module 24 is detachably connected with the coupling module 232 and accommodated within the accommodation space 232e of the coupling module 232.

As shown in FIG. 6C, the pushing part 236 is located at an extension plates 232c of the coupling module 232. The pushing part 236 comprises a push piece 236a and a first groove 236b. The second locking part 235 is located at a short lateral plate 232d of the coupling module 232. The short lateral plate 232d of the coupling module 232 is aligned with the short lateral plate 240c of the hot-swappable module 24 where the first locking part 234 is located. The second locking part 235 comprises a protrusion rod 235a and a second groove 235b. Moreover, the short lateral plate 232d of the coupling module 232 has a concave structure 232f. The second locking part 235 is located in the concave structure 232f. The push piece 236a of the pushing part 236 is located in the first groove 236b and movable within the first groove 236b. The protrusion rod 235a of the second locking part 235 is located in the second groove 235b and movable within the second groove 235b. The push piece 236a of the pushing part 236 and the protrusion rod 235a of the second locking part 235 are linked with each other. While the push piece 236a of the pushing part 236 is moved within the first groove 236b, the protrusion rod 235a of the second locking part 235 is synchronously moved within the second groove 235b. As the protrusion rod 235a of the second locking part 235 is moved within the second groove 235b, the relative location between the protrusion rod 235a and the first hook 234a (or the second hook 234b) of the first locking part 234 is changed. That is, as shown in FIGS. 7A and 7B, the protrusion rod 235a is selectively moved to an initial position P1, a locked position P2 or an unlocked position P3.

Please refer to FIGS. 7A and 7B again. While the hot-swappable module 24 is moved downwardly from the position of FIG. 6B to the accommodation space 232e of the coupling module 232, the relative location between the first locking part 234 and the second locking part 235 is shown in FIG. 7A. That is, as the hot-swappable module 24 is moved downwardly, the first locking part 234 is contacted with the second locking part 235 and the protrusion rod 235a, and the first hook 234a is located at the initial position P1. In the initial position P1, the protrusion rod 235a of the second locking part 235 is contacted with the bottom end of the inclined segment 234a1 of the first hook 234a. As the hot-swappable module 24 is continuously moved downwardly, the protrusion rod 235a of the second locking part 235 is moved upwardly along the inclined segment 234a1 of the first hook 234a. Until the protrusion rod 235a of the second locking part 235 is moved to the locked position P2 between the vertical segment 234b1 and the second horizontal segment 234b2 of the second hook 234b, the protrusion rod 235a is stopped by the second horizontal segment 234b2 of the second hook 234b. Meanwhile, the hot-swappable module 24 is securely fixed in the accommodation space 232e of the coupling module 232.

For removing the hot-swappable module 24, the following process is performed. Firstly, the push piece 236a of the pushing part 236 is moved within the first groove 236b. In response to the horizontal pushing force, the protrusion rod 235a of the second locking part 235 is moved toward the inclined segment 234a1 of the first hook 234a and moved downwardly along the inclined segment 234a1. After the protrusion rod 235a of the second locking part 235 is moved across the bottom end of the inclined segment 234a1, the protrusion rod 235a of the second locking part 235 is contacted with the bottom surface of the first horizontal segment 234a2 of the first hook 234. Meanwhile, as shown in FIG. 7B, the protrusion rod 235a of the second locking part 235 is located at the unlocked position P3. In response to an upward pushing force of the protrusion rod 235a, the hot-swappable module 24 is disengaged from the coupling module 232.

In other words, the hot-swappable module 24 can be securely fixed in the accommodation space 232e of the coupling module 232 through the engagement between the first locking part 234 and the second locking part 235. Moreover, by moving the pushing part 236 to disengage the second locking part 235 from the first locking part, the hot-swappable module 24 is detached from the coupling module 232. Consequently, the hot-swappable module 24 can be easily assembled with or disassembled from the power distribution unit 23.

Please refer to FIGS. 6B and 6C again. The conducting part 246 of the hot-swappable module 24 is located at the junction between the short lateral plate 240c and the bottom plate 240d of the hot-swappable module 24. Moreover, an opening 232g is formed in the bottom plate 232b of the coupling module 232. The location of the opening 232g corresponds to the location of the conducting part 246 of the hot-swappable module 24. When the hot-swappable module 24 is accommodated within the accommodation space 232e of the coupling module 232, the conducting part 246 of the hot-swappable module 24 is penetrated through the opening 232g and contacted with the contact terminal (not shown) of the power distribution unit 23. Consequently, the hot-swappable module 24 is electrically connected with the power distribution unit 23. For accommodating the hot-swappable module 24 within the coupling module 232, it is not necessary to turn off the power distribution unit 23. Similarly, for removing the hot-swappable module 24 from the coupling module 232, it is not necessary to turn off the power distribution unit 23. Consequently, the way of installing or removing the hot-swappable module 24 is user-friendly.

From the above descriptions, the present invention provides a power distribution unit with a hot-swappable module and a power management system with at least one power distribution unit. Preferably, the power management system comprises plural power distribution units. One of the plural power distribution units is a master power distribution unit, and the others of the plural power distribution units are slave power distribution units. The master power distribution unit is in communication with the remote power management unit through an upstream network via the hot-swappable module and in communication with one of the slave power distribution units through an internal network. The slave power distribution units are in communication with each other through the internal network. The operating data or power consumption data of the plural power supply units are transmitted to the remote power management unit through the upstream network. According to a command from the remote power management unit, electric power of the corresponding power supply units is controlled and distributed. If one of the power distribution units has malfunction or damage but the network connection is normal, the other power distribution units can be in communication with the remote power management unit through the master power distribution unit and the upstream network. The power management system can efficiently acquire the real-time power data of each electronic device through the internal network. Since the influence of the external network on the transmission time and transmission amount of the power management system is reduced, the power management system is more efficient and the data transmission path is more stable.

Moreover, due to the hot-swappable function of the hot-swappable module, the hot-swappable module can be easily assembled with or disassembled from the power distribution unit. Once the hot-swappable module is damaged, the user can simply replace the hot-swappable module without the need of turning off the power distribution unit. Since the maintaining and managing process is simplified, the maintenance cost and the management cost of the power management system are reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power distribution unit, comprising:
a power input terminal;
a main body;
plural power-providing units installed on the main body and electrically connected with plural electronic devices to provide electric power to the plural electronic devices;
a coupling module embedded within the main body; and
a hot-swappable module detachably connected with the coupling module and comprising a processor, a first network connection unit, a second network connection unit, a storage unit and a display unit for showing an operating data of the power distribution unit,
wherein when the hot-swappable module is connected with and disposed within an accommodation space of the coupling module, a top plate of the hot-swappable module is at the same level with an extension plate of the coupling module, and the power distribution unit is in communication with a remote power management unit via the first network connection unit of the hot-swappable module and/or an adjacent power distribution unit via the second network connection unit of the hot-swappable module.

2. The power distribution unit according to claim 1, further comprising an engaging module, wherein the hot-swappable module is detachably connected with and fixed in the coupling module through the engaging module.

3. The power distribution unit according to claim 2, wherein the engaging module comprises:
a first locking part disposed on the hot-swappable module; and
a second locking part and a pushing part disposed on the coupling module and linked with the coupling module,
wherein when the hot-swappable module is accommodated within the coupling module, the first locking part and the second locking part are engaged with each other, so that the hot-swappable module is connected with and fixed in the coupling module, wherein while the pushing part is moved and the second locking part is correspondingly moved to an unlocked position, the hot-swappable module is disengaged from the coupling module.

4. The power distribution unit according to claim 1, wherein the first network connection unit is in communication with the remote power management unit through an upstream network.

5. The power distribution unit according to claim 1, wherein the second network connection unit is in communication with the adjacent power distribution unit through an internal network.

6. The power distribution unit according to claim 1, wherein the hot-swappable module further comprises a G-sensor for sensing a tilt angle.

7. The power distribution unit according to claim 1, wherein the hot-swappable module further comprises at least one connection port, and the at least one connection port is connected with at least one external device.

8. A power management system, comprising:
a remote power management unit;
at least one power distribution unit, wherein each power distribution unit comprises a hot-swappable module and a coupling module; and
at least one power supply unit electrically connected with the corresponding power distribution unit,
wherein when the hot-swappable module is connected with and disposed within an accommodation space of the coupling module, a top plate of the hot-swappable module is at the same level with an extension plate of the coupling module, and the at least one power distribution unit is in communication with the remote power management unit through an upstream network via the hot-swappable module and in communication with an adjacent power distribution unit through an internal network, wherein an operating data or a power consumption data of the at least one power supply unit is transmitted to the remote power management unit, wherein according to a command from the remote power management unit, electric power of the corresponding power supply unit is controlled and distributed.

9. The power management system according to claim 8, wherein the upstream network is a local area network or a wide area network.

10. The power management system according to claim 8, wherein each power supply unit further comprises an engaging module, wherein the hot-swappable module is detachably connected with and fixed in the coupling module through the engaging module.

11. The power management system according to claim 8, wherein the hot-swappable module comprises:
- a processor;
- a first network connection unit in communication with the remote power management unit;
- a second network connection unit in communication with the adjacent power distribution unit;
- a storage unit; and
- a display unit for showing an operating data of the power distribution unit.

12. A power management system, comprising:
- a remote power management unit;
- plural power distribution units, wherein each of the plural power distribution units comprises a hot-swappable module and a coupling module; and
- plural power supply units electrically connected with the corresponding power distribution units,
- wherein when the hot-swappable module is connected with and disposed within an accommodation space of the coupling module, a top plate of the hot-swappable module is at the same level with an extension plate of the coupling module, and one of the plural power distribution units is a master power distribution unit, and the others of the plural power distribution units are slave power distribution units, wherein the master power distribution unit is in communication with the remote power management unit through an upstream network via the hot-swappable module and in communication with one of the slave power distribution units through an internal network, and the slave power distribution units are in communication with each other through the internal network, wherein operating data or power consumption data of the plural power supply units are transmitted to the remote power management unit through the upstream network, wherein according to a command from the remote power management unit, electric power of the corresponding power supply units is controlled and distributed.

13. The power management system according to claim 12, wherein the upstream network is a local area network or a wide area network.

14. The power management system according to claim 12, wherein each power supply unit further comprises an engaging module, wherein the hot-swappable module is detachably connected with and fixed in the coupling module through the engaging module.

15. The power management system according to claim 12, wherein the hot-swappable module comprises:
- a processor;
- a first network connection unit in communication with the remote power management unit;
- a second network connection unit in communication with the adjacent power distribution unit;
- a storage unit; and
- a display unit for showing an operating data of the power distribution unit.

\* \* \* \* \*